(12) United States Patent
Beaman et al.

(10) Patent No.: US 7,218,129 B2
(45) Date of Patent: May 15, 2007

(54) SYSTEM, APPARATUS AND METHOD FOR CONTROLLING TEMPERATURE OF AN INTEGRATED CIRCUIT UNDER TEST

(75) Inventors: Daniel Paul Beaman, Cedar Park, TX (US); Robert F. Florence, Jr., Poughkeepsie, NY (US); Howard Victor Mahaney, Jr., Cedar Park, TX (US); Frederic William Wright, IV, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 11/034,332

(22) Filed: Jan. 12, 2005

(65) Prior Publication Data

US 2006/0152238 A1    Jul. 13, 2006

(51) Int. Cl.
*G01R 31/02* (2006.01)
(52) U.S. Cl. .................................................. 324/760
(58) Field of Classification Search ............... None
See application file for complete search history.

(56) References Cited

U.S. PATENT DOCUMENTS

| | | | |
|---|---|---|---|
| 5,522,452 A * | 6/1996 | Mizuno et al. ............. 165/286 |
| 6,184,504 B1 * | 2/2001 | Cardella .................... 219/513 |
| 6,489,793 B2 | 12/2002 | Jones et al. |
| 6,583,638 B2 * | 6/2003 | Costello et al. ............. 324/760 |
| 6,628,132 B2 * | 9/2003 | Pfahnl et al. ............... 324/760 |
| 6,636,062 B2 * | 10/2003 | Gaasch et al. ............. 324/760 |
| 6,857,283 B2 * | 2/2005 | Tilton et al. ............... 62/259.2 |
| 6,911,836 B2 * | 6/2005 | Cannon et al. ............. 324/765 |
| 6,972,581 B2 * | 12/2005 | Yamashita et al. .......... 324/760 |
| 2005/0189342 A1 * | 9/2005 | Kabbani ..................... 219/494 |

* cited by examiner

*Primary Examiner*—Ha Tran Nguyen
*Assistant Examiner*—Richard Isla-Rodas
(74) *Attorney, Agent, or Firm*—Mark E. McBurney; Libby Z. Handeisman; Schubert Osterrieder & Nickelson PLLC

(57) ABSTRACT

A system, apparatus and method for controlling temperature of an integrated circuit in a chip tester is disclosed. Embodiments include supplying a chilled fluid to a cold plate at a first flowrate, where the first flowrate is associated with a first valve setting based on at least a desired temperature setpoint and an applied power. Embodiments may determine a change in applied power and modify the chilled fluid flowrate in response to a change in testing conditions to a second flowrate associated with a second valve setting associated with at least the desired temperature setpoint and the changed testing conditions. This feed forward loop may be supplemented by a feedback loop that includes modifying the energy supplied to a cold plate heater in response to a comparison of a current temperature and the temperature setpoint. The valve may be a proportional control valve or the like.

17 Claims, 3 Drawing Sheets

SYSTEM, APPARATUS AND METHOD FOR CONTROLLING TEMPERATURE OF AN INTEGRATED CIRCUIT UNDER TEST

FIELD OF INVENTION

The present invention is in the field of temperature control of a system. More particularly, the present invention relates to temperature control in an integrated circuit processing and testing system.

BACKGROUND

High performance processor chips, which are also known as microchips or integrated circuits (ICs), are often tested and subsequently sorted based on their performance and matched to a given class of machine. Individual chips are tested prior to installation on modules in machines in order to identify chip failures, allowing higher machine manufacturing productivity and improving product quality. Test equipment developed to support performance, productivity and quality is usually required to meet functional test limits defined by several boundary variables such as chip/module voltage, clock speed, power dissipation, and temperature.

Chip testers such as functional or non-functional testers may detect chip failures during testing at different operating temperatures. Chips are typically tested at operating temperatures they might encounter in the field so that failures are eliminated before the chip reaches the customer. Additionally, testing chips at particular operating temperatures may facilitate determining particular failure modes. For example, chip testing often requires the chips to be cooled to low temperatures in order to find certain possible failures, including temperatures as low as −20 degrees Celsius (C.). Some early use failures which might not have normally occurred until after reaching a customer may be found during testing at elevated temperatures. As an example, a faulty interconnection on a chip can be detected by testing at either low or high temperatures. In this example, two conductors may touch each other with sufficient force that an electrical connection is made even though the parts are not mechanically interconnected. Such a part may pass tests and reach a customer, but will likely fail at a higher frequency rate than is acceptable. If a chip is tested at these temperatures, this marginal interconnection may separate and thereby identify the faulty part.

The performance of a chip also often varies based on the operating temperature of the chip, making temperature control of the chip an integral part of chip testing. Accurate temperature control over a wide range of temperatures during chip testing processes allows verification of whether a processor functions at all, as well as it how it performs. For example, accurate temperature control allows a chip tester to determine whether a processor of a chip functions at a particular temperature and more specifically how many of its processor cores function at that temperature. Testing with precise control over the chip temperature and local temperature distribution also allows more precise determination of chip speed, helping to minimize the guardband (i.e., extra margin) that is put into the acceptance criteria for a good chip, allowing an increase in the manufacturing yield. Another benefit of accurately controlling the temperature of a chip during testing is more precise determination of power dissipation of the chip during product level conditions. Precise determination of power dissipation facilitates directing higher power chips to products that have greater power supply and cooling capacity while directing lower power chips to products with less capacity. This may increase chip yield as all chips are not required to function to the more restrictive conditions of less capable systems.

Failure to precisely control thermal conditions during chip testing may result in finding fewer faults, having to increase the guardband on sorted speed, and reduced ability to determine power dissipation. These failures may result in lower chip yields, lower customer satisfaction, higher warranty costs, and overall decrease in efficiency in chip production. These problems are exacerbated as chips become more and more powerful, as more powerful chips often require more precise temperature control due to their higher frequency, higher leakage, and higher power dissipation. There is, therefore, a need for an effective and efficient system to control temperatures in a chip tester system. There is an even greater need for such a system as chips become more and more powerful and require more accurate temperature control.

SUMMARY OF THE INVENTION

The problems identified above are in large part addressed by a system, method, and apparatus for controlling the temperature of an integrated circuit under test. One embodiment generally provides a method for controlling the temperature of an integrated circuit during testing. The method may generally include supplying a chilled fluid to a cold plate at a first flowrate, the cold plate being positioned to cool the integrated circuit, where the first flowrate is associated with a first valve setting, the valve setting being based on at least a desired integrated circuit temperature setpoint and a power applied to the integrated circuit. The method may also include determining a change in testing conditions and modifying the chilled fluid flowrate from the first flowrate to a second flowrate in response to the determined changed in applied power, the second flowrate being associated with a second valve setting, and the second valve setting being based on at least the desired temperature setpoint and the new testing conditions. Further embodiments may include after modifying the chilled fluid flowrate, modifying the amount of energy supplied to a cold plate heater in response to a difference between an integrated circuit temperature and the desired integrated circuit temperature setpoint. The change in testing conditions may include changes to the power applied to the integrated circuit, actual chip to cold plate thermal interface resistance, chiller inlet temperature, or heater settings.

Another embodiment generally provides a system to test an integrated circuit that includes in one embodiment a cold plate connected to a source of chilled fluid via a chilled fluid loop so that the temperature of the cold plate is lowered by the chilled fluid, where the cold plate is adapted to be positioned so as to modify the temperature of the integrated circuit under test. The embodiment also generally includes at least one heater for supplying heat to the cold plate when power is supplied to the at least one heater and a proportional control valve positioned in the chilled fluid loop and having a valve setting which controls the flowrate of chilled fluid from the source to the cold plate. The embodiment also generally includes a thermal control system adapted to control the temperature of the integrated circuit to a desired temperature setpoint by changing the valve setting. In other embodiments, the thermal control system may be further adapted to compare a current integrated circuit temperature with the desired temperature setpoint and to further control the temperature of the integrated circuit by modifying the supplied heater power in response to a difference between the current integrated circuit temperature and the desired temperature setpoint.

A further embodiment provides a system to test an integrated circuit that includes in one embodiment a cold plate connected to a source of chilled fluid via a chilled fluid loop so that the temperature of the cold plate is lowered by the chilled fluid, where the cold plate is adapted to be positioned so as to modify the temperature of the integrated circuit under test. The embodiment also generally includes at least one heater for supplying heat to the cold plate when power is supplied to the at least one heater and a proportional control valve having a valve setting which controls the flowrate of chilled fluid from the source to the cold plate. The embodiment also generally includes a thermal control system adapted to provide coarse temperature control of the integrated circuit to a desired temperature setpoint by changing the valve setting in response to a change in testing conditions of the integrated circuit under test in a feed forward control loop and to provide fine control by modifying the supplied heater power in response to a difference between the current integrated circuit temperature and the desired temperature setpoint in a feedback control loop.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

Figure 2:
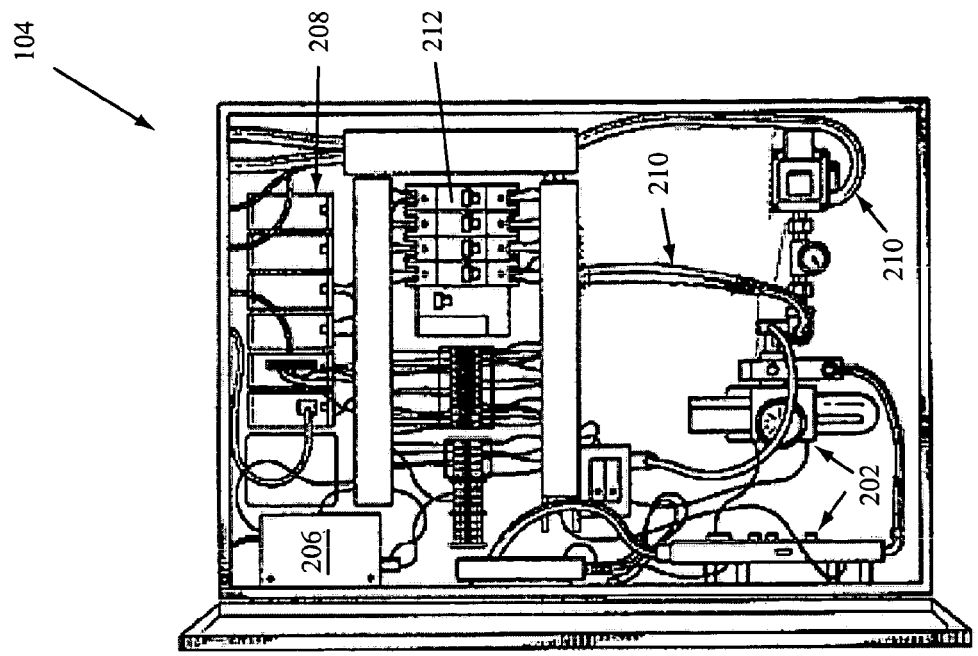
FIG. 2 depicts a thermal control system of the chip tester of FIG. 1 according to one embodiment.

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

A system, apparatus and method for controlling temperature of an integrated circuit in a chip tester is disclosed. Embodiments include supplying a chilled fluid to a cold plate at a first flowrate, where the first flowrate is associated with a first valve setting based on at least a desired temperature setpoint and an applied power. Embodiments may determine a change in applied power and modify the chilled fluid flowrate in response to a change in testing conditions to a second flowrate associated with a second valve setting associated with at least the desired temperature setpoint and the changed testing conditions. This feed forward loop may be supplemented by a feedback loop that includes modifying the energy supplied to a cold plate heater in response to a comparison of a current temperature and the temperature setpoint. The valve may be a proportional control valve or the like.

The disclosed embodiments provide an improved and effective system for controlling the temperature of an integrated circuit under test. In the disclosed embodiments, the flowrate of chilled fluid to the cold plate may be controlled with a feed forward loop to provide more accurate control of temperatures. The flowrate of the chilled fluid may be controlled by a proportional control valve whose setting may be changed in response to changes in testing conditions, such as changes to the power applied to the integrated circuit under test. By responding to changes in applied power, for example, a precursor to temperature changes in an integrated circuit, a more effective and smoother temperature control is provided. The proportional control valve of some embodiments may also provide additional benefits in allowing for precise setting of the flowrate and flexibility between and during integrated circuit tests. A fine temperature control in addition to the coarse temperature control of the proportional control valve may also be provided by modifying the power applied to cold plate heaters in response to integrated circuit temperatures in a feedback loop to provide a two-level control scheme. The system of the disclosed embodiments may, by providing quicker and more accurate temperature control, allow for more efficient testing, reduced guardband on sorted speed, higher customer satisfaction, lower warranty costs, higher chip yields, and fewer failures in the field.

Various embodiments of the present invention provide systems and methods for controlling the temperature of an integrated circuit under test. The following description provides specific details of certain embodiments of the invention illustrated in the drawings to provide a thorough understanding of those embodiments. It should be recognized, however, that the present invention can be reflected in additional embodiments and may be practiced without some of the details in the following description. In other instances, well-known structures and functions have not been shown or described in detail to avoid unnecessarily obscuring the description of the embodiments of the invention. While specific embodiments will be described below with reference to particular configurations and systems, those of skill in the art will realize that embodiments of the present invention may advantageously be implemented with other substantially equivalent configurations and/or systems.

Figure 1:
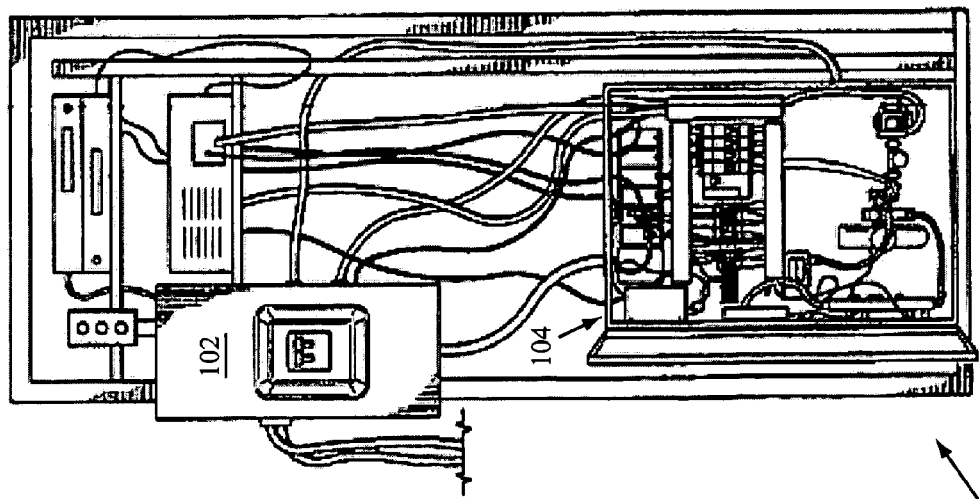
FIG. 1 depicts a rear view of a chip tester including a thermal control system according to one embodiment.

Turning now to the drawings, FIG. 1 depicts a rear view of a chip tester including a thermal control system according to one embodiment. Chip tester 100 may include the equipment necessary for performing testing of chips or other integrated circuits (chips herein), such as a nest unit (not shown, see FIG. 3), thermal control system 104, and power box 102. In addition, chip tester 100 may include a chiller (not shown) for supplying cooled fluid and a card (not shown, see FIG. 3) for receiving the chip to be tested. The power box 102 may provide and/or distribute electrical power to other components of the chip tester 100.

The chip tester 100 may be employed in manufacturing to ensure the quality and robustness of processors before they are placed in a computer (such as a server) and shipped to customers. Many processors have multiple processor cores on a single silicon chip. The goals of such testing may include verifying how many of the processor cores are good, sorting the processors into different buckets so they can be used in the corresponding speed-rated product, and providing some burn-in of the chips to find early faults. Typically, the chip tester 100 will perform processor tests for up to four hours for each chip. During this time, differing software applications are run on the chip and each of the applications may result in differing power dissipation within the chip. The different applications may attempt to detect particular failures or to simulate conditions the chip may undergo with a customer. It has been found that different modes of chip failure are evidenced more easily at particular temperatures, making testing at different temperatures part of the testing routine. Additionally, the speed sorting of the chips should be done at the temperature they will run at in the actual product, which will vary depending on the customer's application and hardware. Hence, the chip tester 100 advantageously should be able to control the chip under test to a wide range of pre-specified temperatures during different parts of the test.

The chiller may provide a low temperature source of liquid for cooling a chip. In one example, the chiller may provide flowrates up to 1.6 gallons/minute of a 50/50 mixture of ethylene glycol and water at a temperature of –20 C may be provided. Any other appropriate type of coolant liquid may also be used, such as heat transfer fluids from Deynalene® which may provide for fluid temperatures as low as –40 C. The cold liquid may, in one embodiment, flow from the chiller through insulated lines to the cold plate where the flowrate may be controlled by one or more valves, such as a proportional control valve, all as part of a chilled fluid loop. The chiller may cool a heat transfer liquid to, e.g., –20 C for the specific processor test application, and an internal pump may provide pressure to move the chilled fluid through components in the chilled fluid loop and return it to the chiller for reuse. The chilled fluid loop may include mechanisms to prevent frost or condensation formation, such as by using insulated ethylene propylene diene/rubber (EPDM) hoses to transport chilled fluid. In one embodiment, the thermal control system 104 may control the chiller, including turning the chiller off or on, changing the temperature setting of the chiller, etc.

The thermal control system 104, which is described in more detail in relation to FIG. 2, may control coolant flow throughout the chilled fluid loop, compressed air flow to the nest air cylinder, cold plate to chip interface gas flow, cartridge heater functions, and temperature control functions. From the chiller, chilled fluid may pass to the nest unit, such as through EPDM hose. The nest unit may contain the metal cold plate which absorbs heat from the chip in test and transfers it to the chilled fluid via a set of internal channels. After the heat transfers from the tested chip to the cold plate and then to the coolant fluid, the fluid may then be transported by the insulated hose back to the chiller where it is again cooled for reuse.

The chip tester 100 may test a chip at multiple different temperature setpoints and at different applied power settings (resulting in different chip power dissipation levels). On-Chip-Temperature-Sensors (OCTS) may measure temperatures of the chip itself. A predetermined fluid flowrate may be chosen for each setpoint and provided by the chiller, valve and associated interconnections. The setpoint temperature may then be maintained by use of a feed forward loop controlling a proportional control valve for coarse control and heaters in the cold plate for fine control, as described in more detail in relation to FIG. 4. When a given phase of the testing is completed, the flowrate and/or temperature of the chilled liquid may be changed for the next phase to adjust the OCTS temperature to within range of the next desired temperature setpoint. This next phase may typically be associated with a different software application, chip voltage, and/or chip frequency, any of which will contribute to a different chip power dissipation level. The new desired temperature setpoint may be maintained via the coarse temperature feed forward loop previously described and a temperature feedback loop for fine control. By using the temperature control system of the disclosed embodiments, the temperature of a chip under test may advantageously be more precisely controlled at different temperatures and different power dissipation levels, allowing for more accurate testing and increased efficiency.

FIG. 2 depicts a thermal control system 104 of the chip tester of FIG. 1 according to one embodiment. The thermal control system 104 may include air/helium controls 202, a heater power supply 206, a programmable logic controller (PLC) 208, one or more hoses 210, and a ground fault circuit interrupter/breaker (GFCI) 212. Compressed air from the air/helium controls 202 may drive the cold plate up and down, while helium may improve the thermal interface between the chip and cold plate. The heater power supply 206 may power the heaters of the cold plate itself and of the card backside. The PLC 208 may control most functions of the thermal control system 104, such as controlling fluid flow, the setting of the proportional control valve, power applied to the heaters, and managing the feed forward loop which allows temperature to be maintained at a desired setpoint during testing. The PLC 208 may also provide for system shutdown in the event of a malfunction, starting and stopping the chiller pump and compressor, controlling the output temperature of the chiller, chiller diagnostics, monitoring system alarms, and controlling outlet temperature. The GFCI 212 may detect electrical faults and interrupt any electrical circuits of the chip tester 100 in the event of a fault or other failure. While the thermal control system 104 is depicted as being within an enclosed box located within the chip tester 100, one of ordinary skill in the art will recognize that the thermal control system 104 may be configured in any way, such as in different locations within the chip tester 100 or spread over multiple locations, in an open box, or in any other configuration.

The thermal control system 104 (as may be controlled by the PLC 206) may use any type of control scheme to control the temperature of the chip under test. In one embodiment, the thermal control system 104 may use a feed forward control loop of a proportional control valve (based on changes in testing conditions such as changes to applied power) for coarse or gross control of chip temperature and a temperature feedback loop which controls how much power is dissipated by the heaters in the cold plate for fine control. The feed forward control loop may use the setting of the proportional control valve to control the flowrate of chilled fluid to the cold plate to provide its coarse control. This control scheme advantageously provides more accurate and quicker responding thermal control than previous systems and is described in more detail in relation to FIG. 4.

Figure 3:
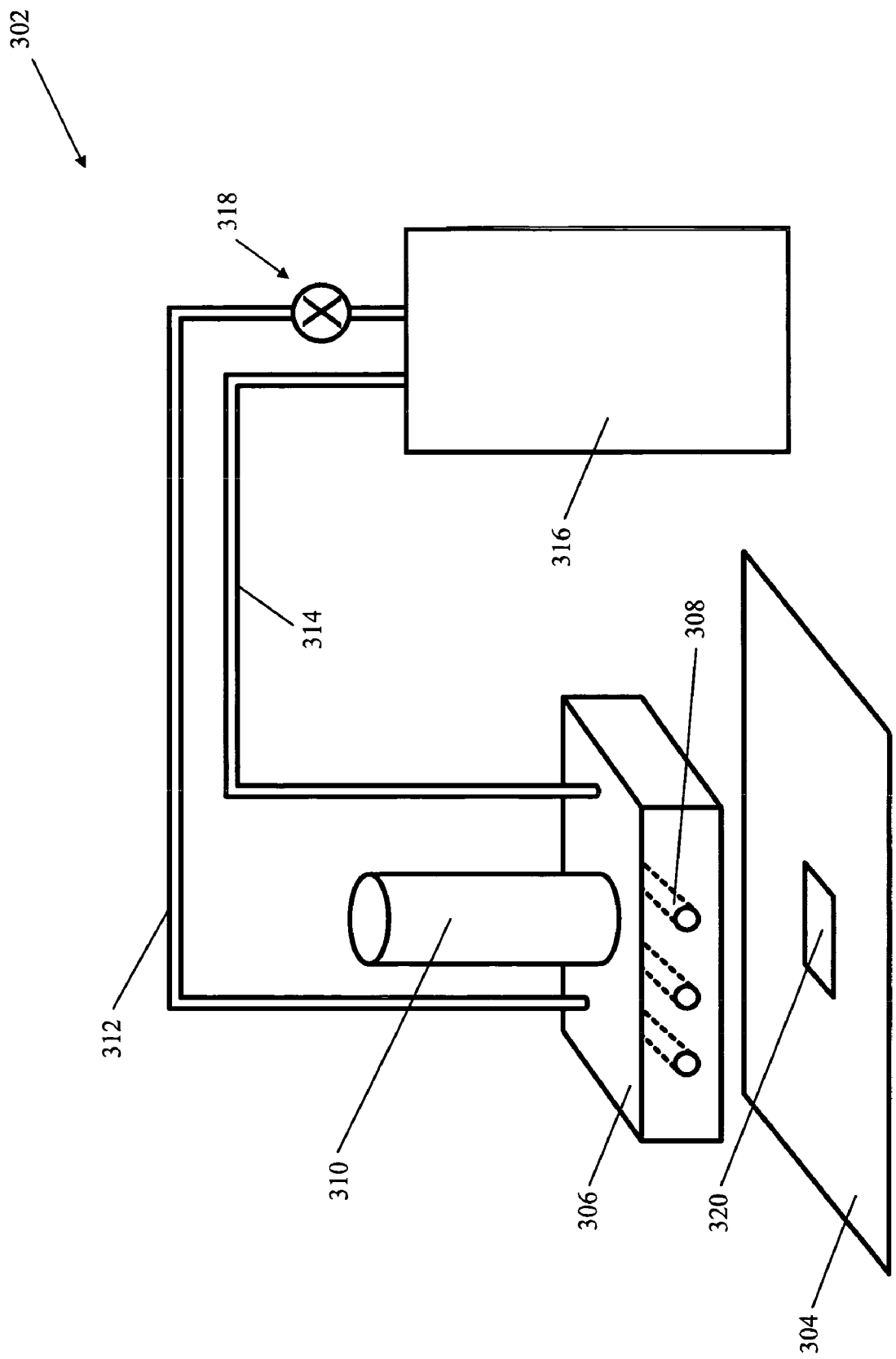
FIG. 3 depicts a schematic view of a nest unit, chiller, and proportional control valve of the chip tester of FIG. 1 according to one embodiment.

FIG. 3 depicts a schematic view of a nest unit, chiller, and proportional control valve of the chip tester 100 of FIG. 1 according to one embodiment. The nest unit 302 may include a card 304, a cold plate 306, one or more heaters 308, and an air cylinder 310. The card 304 may include a socket for the chip 320 to be tested. In one embodiment, the nest unit 302 may center on the location in the chip tester 100 where the chip 320 being tested sockets to the card 304. The card 304 may be equipped with heaters such as cartridge heaters (not shown) on its backside for control of the temperature of the backside and to eliminate condensation formation when the cold plate 306 is chilled by fluid. In this embodiment, the card heaters may prevent temperatures on the backside from becoming low enough that frost or condensation forms. Heaters may be any device that dissipates heat, such as small diameter cylinders (cartridge heaters) that dissipate heat when power is applied. The nest unit 302, and specifically the cold plate 306, may be in fluid communication with the chiller 316 via fluid lines 312, 314.

The cold plate 306 may include fluid passages (not shown) for cooling fluid and may be made of a thermally conductive material such as copper or other metal. The cooling fluid may extract thermal energy from the cold plate 306 while it passes through or adjacent the cold plate 306. The flowrate and temperature of the cooling fluid will impact the rate and amount of thermal energy transferred to the cooling fluid. The cold plate 306 may also include one or more heaters 308 positioned so as to increase the temperature of cold plate 306, such as in response to a command from the PLC 206 as part of a feed forward or feedback loop. The heaters 308 may be positioned adjacent the cold plate 306, internal to the cold plate 306, or in any other location where they may transfer heat to the cold plate 306. In the depicted embodiment, heaters 308 are cartridge heaters located internal to the cold plate 306. Alternatively, heaters 308 may be patch heaters designed to be placed adjacent to one or more surfaces. By varying the power supplied to the heaters 308, the temperature of the cold plate 306 and chip 320 may be controlled. Fluid line 312 in the chilled fluid loop may supply chilled fluid to the cold plate 306 from the chiller 316 and back to the chiller 316 from the cold plate 306 via fluid line 314.

In one embodiment, there may be two or more heaters 308 positioned adjacent to or embedded in the cold plate 306 to provide even heat distribution to the cold plate 306 and ultimately the chip 320. The interface resistance between the cold plate and chip may be minimized by a gimbaled cold plate 306, high pressure spring load, and/or controlled flatness of the cold plate 306. Additionally, helium from the air/helium controls 202 may be injected at the cold plate/chip interface to replace the air that would normally occupy small spaces between the two surfaces, improving the cold plate/chip interface thermal resistance.

The air cylinder 310 may control the position of the cold plate 306 by linearly moving the cold plate 306 between an open position and a closed position. The open position (shown in FIG. 3) may provide an open space through which the module with the chip may be manually installed, while the closed position allows heat to be transferred from the chip to the cold plate 306. To place the cold plate 306 in the closed position for testing, the air cylinder 310 may provide pneumatic pressure to drive the cold plate 306 suspension against the module, electrically engaging the processor under test to the socket and ultimately to the processor card 304. The placement of the cold plate 306 in the closed position may also complete the thermal path from the chip to the cold plate 306 to the cold fluid within the cold plate 306.

As described previously, chilled fluid may pass through fluid line 312 from the chiller 316 to the cold plate 306 and then back to the chiller via fluid line 314. A proportional control valve 318 may, in one embodiment, be positioned in fluid line 312 to control the rate of chilled fluid transfer through the cold plate 306. Alternatively, the proportional control valve 318 may be located in fluid line 314, in the chiller 316, in the nest unit 302, in the fluid loop, or other location. In one embodiment, the proportional control valve 318 is a stepper motor controlled proportional control valve which is also controlled by the PLC 206. In this embodiment, the proportional control valve 318 may provide any desired flowrate setting to the coldplate 306 up to the limit of the chilled fluid loop. The proportional control valve 318 (also known as a proportional valve or control valve) may be power-operated and of any type, such as a glove, diaphragm, pinch, knife, gate, needle, butterfly, ball, or plug valve. Other types of flow control devices may also be used instead of a proportional control valve 318. The proportional control valve 318 may provide a continuous variation in fluid flowrate supplied to the coldplate 306, allowing the entire range of powers to be cooled instead of a few discrete power ranges over the entire power domain.

Previous flowrate control schemes required a manifold and a series of valves which resulted in a finite number of possible flowrates that depended on the valve configuration. Each valve could be set in an open or closed position and a tester would configure the valves before testing commenced. The particular valve configuration would result in a system that would provide only certain flowrates and, thus, only would cover discrete cooling situations. Since the number of possible flowrates which could be delivered to the coldplate under previous configurations was limited to discrete ranges, previous chip testers were not able to provide cooling for any arbitrary power but instead were only able to provide cooling capacity for a discrete number of cases. Moreover, it would often be necessary to manually reconfigure the valves when different chips were tested or different test patterns were used, slowing down testing and processing of chips. In contrast, the proportional control valve 318 allows cooling of any chip power up to the maximum cooling capacity of the chip tester 100 without reconfiguration.

Due to the increasing leakage in chips as chip technology advances, it becomes more important to provide a temperature distribution on the chip during testing that replicates usage of the chip in the product so that accurate measurements of chip speed and power can be made. The design of the cold plate 306 will impact the temperature distribution on the chip 320 being tested. In one embodiment, the cold plate pedestal (the portion of the coldplate 306 that touches the chip) may be smaller than the surface of the chip 320 to mitigate cracking of the chip 320 when pressure is applied. In other embodiments, a cold plate pedestal larger than the chip 320 may be used so as to provide a temperature distribution on the chip 320 that more closely replicates that of the final product, as the product-level cooling solution typically consists of hardware which is also larger than the chip 320. Larger cold plate pedestals may safely be used by, for example, employing proper coldplate 306 gimbaling and a slow contact speed when the coldplate 306 engages the chip 320. A coldplate pedestal that overhangs the chip 320 may provide a chip temperature distribution which more closely resembles the product level temperature distribution and hence will result in improved prediction of chip speed and power dissipation. The local chip temperature distribution may also be improved by the choice of copper or other high thermal conductivity material for the cold plate 306 material.

Figure 4:
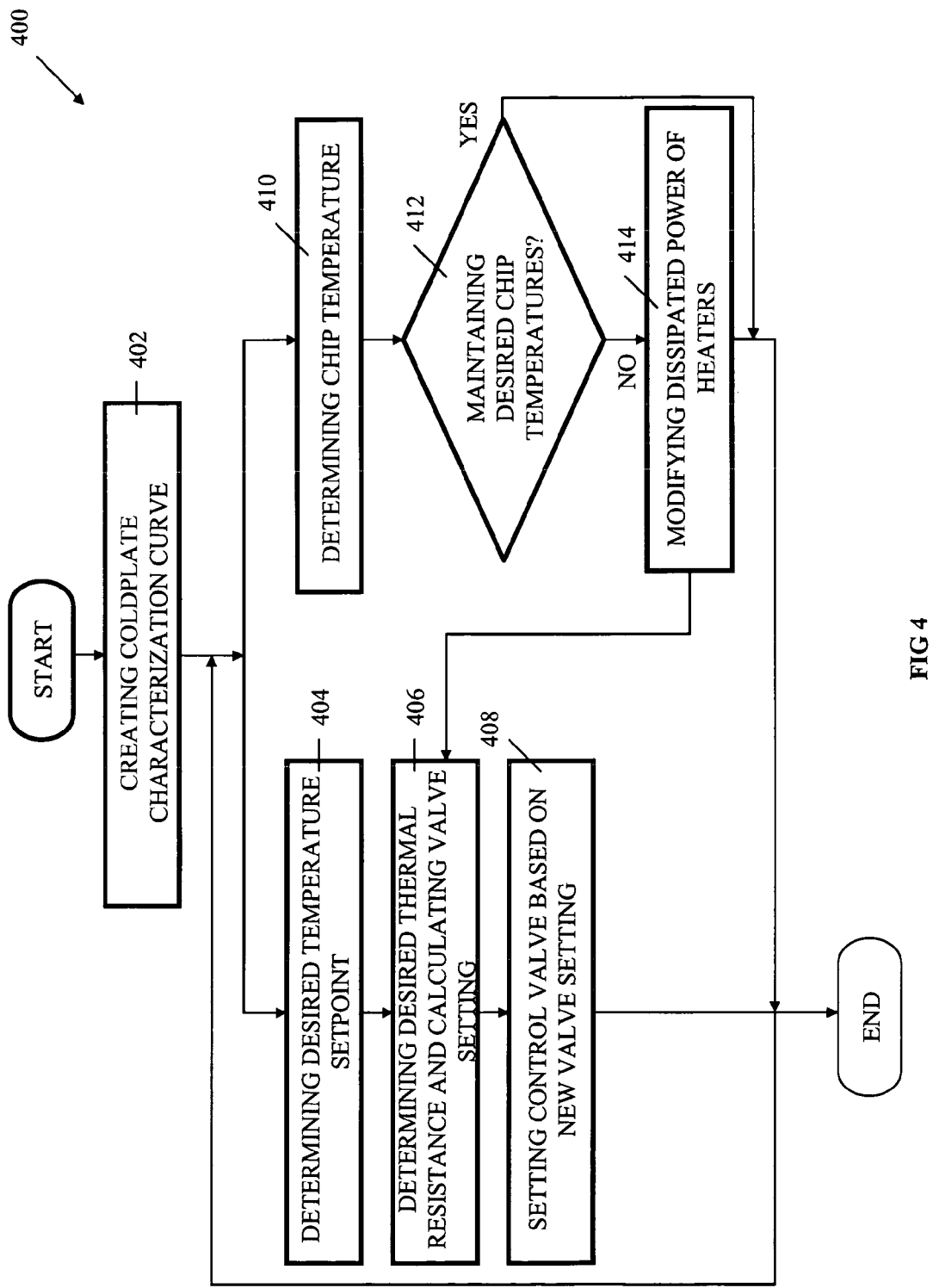
FIG. 4 depicts an example of a flow chart for controlling the temperature of an integrated circuit in a chip tester according to one embodiment.

FIG. 4 depicts an example of a flow chart for controlling the temperature of an integrated circuit in a chip tester 100 according to one embodiment. The elements of flow chart 400 may be performed, in one embodiment, by a PLC 208 of a chip tester 100. Flow chart 400 begins with element 402, creating a coldplate characterization curve. Element 402 may be performed only once during the tool calibration phase for a particular chip tester 100 or for a particular test. The coldplate characterization curve may be represented as a table of coldplate thermal resistances versus proportional control valve 318 settings. After creating the coldplate characterization curve, flow chart 400 then continues on one or both of two parallel paths, one of which is to element 404, determining the desired temperature setpoint. The desired temperature setpoint may, in one embodiment, be based on a software routine used by chip tester 100 to test a chip or other integrated circuit. The software routine may be designed to test a chip in some way, such as to simulate customer conditions or detect a particular failure mode. At any given time, the software routine may have a desired temperature setpoint, which is the temperature at which the chip should be tested. As the software routine performs the test on the chip, the desired temperature setpoint may change up or down numerous times. Alternatively, the desired temperature setpoint may be based on user input or other means. The desired temperature setpoint may relate to a junction temperature, an average chip temperature, or other temperature.

After determining the desired temperature setpoint, flow chart 400 continues to element 406, determining the desired thermal resistance and calculating the proportional control valve 318 setting associated with that flowrate. The required coldplate thermal resistance may be computed from the testing conditions, which may include the desired temperature setpoint, current processor-under-test power dissipation, actual chip to coldplate thermal interface resistance, chiller inlet temperature, current heater 308 settings, and/or midpoint of the allowable control range of the heaters 308. The proportional control valve 318 may then be set based on the required coldplate thermal resistance and the coldplate characterization curve from the tool calibration phase. If proportional control valve 318 is a modulated stepper motor control valve or other control valve with flexible positioning between its lower and upper limits, any coldplate thermal resistance within the limits of the chip tester 100 may be achieved. After calculating the proportional control valve 318 setting at element 406 based on the coldplate characterization curve, the PLC 208 at element 408 may set the proportional control valve 318 to that setting.

Elements 404, 406, and 408 together form a feed forward loop for control of chip temperature by controlling the setting of the proportional control valve 318 based on the testing conditions instead of chip temperature. This provides for improved control of chip temperature and may smooth undershoots and overshoots of the actual chip temperature when compared to the desired temperature setpoint. For example, if the power applied to the chip 320 under test changes as part of the software scheme controlling the test, the proportional control valve 318 may be adjusted in response to the change in testing conditions prior to sensing a temperature change at the chip 320. As all the power applied to a chip becomes heat generated by the chip, the applied power serves as an effective input to a feed forward control scheme. A feed forward control scheme may provide a much quicker response to deviations in the applied power when compared to temperature feedback schemes. For example, if the chip power suddenly increases the control system provides additional cooling by increasing the flowrate (by opening the proportional control valve 318 more) and does not wait for an increasing chip temperature to signal the need for more cooling. In this manner, temperature deviations from the setpoint may be minimized. Similarly, other variables may be utilized in the feed forward scheme, such as changes to the desired temperature setpoint, actual chip to coldplate thermal interface resistance, chiller inlet temperature, or current heater 308 settings.

Due to requiring a quick thermal response due to large changes in chip power, temperature control during chip testing may be based on a two part algorithm. The algorithm may include a coarse adjustment using the proportional control valve 318 in a feed forward control scheme as described in relation to elements 404, 406, 408 to provide gross temperature control as well as a fine adjustment using the heaters 308 of the cold plate 306 using a feedback scheme. The feedback control of chip temperature may begin at element 410 with the second parallel path, determining chip temperature. In one embodiment, the chip temperature is determined based on readings from one or more OCTS sensors. After determining the chip temperatures, flow chart 400 continues to decision block 412, determining if the desired chip temperature is being maintained. Decision block 412 provides the fine control of chip temperature via a feedback control scheme. If the desired chip temperature is being maintained (e.g., within an acceptable level of the desired temperature), flow chart 400 continues or terminates. If the desired chip temperature is not being maintained, flow chart 400 continues to element 414, modifying the dissipated power of the heaters 308 of the cold plate 306. By modifying the dissipated power of one or more heaters 308 of the cold plate 306, the chip temperature may be maintained at the desired temperature in a feedback loop. The fine control of the heaters 308 may be provided via a closed loop proportional-integral-derivative (PID) algorithm based on chip temperature setpoint and actual temperature or any other control scheme. The new setting of the heaters 308 may be fed into the feed forward loop at element 404 for use in determining the desired thermal resistance.

One of ordinary skill in the art will recognize that any combination of temperature feedback loop and the feed forward loop may be used. For example, the feedback loop and feed forward loop may run in parallel, in series, or be integrated. Any combination of factors may be implemented in the feed forward loop, including applied power.

Having both coarse and fine control of the temperature is valuable because large power swings or spikes may occur during a given phase of the test, while even larger swings may occur between different phases of a test. By the use of a feed forward control, the temperature control system of the disclosed embodiments provides temperature control when power dissipation varies dramatically, e.g., 20 W up to 225 W, or other changes to the testing conditions occur. Other temperature control solutions such as controlling only based on fluid flowrate and/or fluid temperature would not provide the same level of thermal control for a dynamically varying power dissipation level as the disclosed temperature control system. Tests have indicated that the temperature control system of the disclosed embodiments is very effective in controlling chip temperature in the event of power fluctuations, with instantaneous fluctuations of up to 30–40 W only varying the chip temperature by approximately 4 degrees Celsius or less.

Utilizing a proportional control valve 318 may also provide benefits in a temperature control system. First, when used in conjunction with the feed forward control scheme described previously, a proportional control valve 318 to control the flowrate of cooling fluid to the cold plate 306 provides more precise control over the flowrate when compared to previous systems because of the flexibility of the proportional control valve 318. Moreover, the relative ease of changing the setting of a proportional control valve 318 allows for a chip tester 100 that requires reduced manpower to operate and more flexibility for different tests that require different cooling fluid flowrates, as the proportional control valve 318 may be quickly set for any desired flowrate within the capability of the thermal control system. This also may provide additional flexibility during a test by allowing any desired flowrate to be used during the test by changing the setting of the proportional control valve 318 during the test.

It will be apparent to those skilled in the art having the benefit of this disclosure that the present invention contemplates a system, method and apparatus for controlling the temperature in a chip tester. It is understood that the form of the invention shown and described in the detailed description and the drawings are to be taken merely as examples. It is intended that the following claims be interpreted broadly to embrace all the variations of the example embodiments disclosed.

What is claimed is:

1. A method for controlling the temperature of an integrated circuit during testing, the method comprising:
    supplying a chilled fluid to a cold plate at a first flowrate, the cold plate being positioned to cool the integrated circuit, and the first flowrate being associated with a first valve setting of a proportional control valve, the first valve setting being based on at least a desired temperature setpoint and a power applied to the integrated circuit;
    determining a change in testing conditions prior to detecting a change in integrated circuit temperature, the change in testing conditions comprising a change in power applied to the integrated circuit that will result in a change in temperature of the integrated circuit; and
    modifying the chilled fluid flowrate from the first flowrate to a second flowrate in response to the change in testing conditions utilizing a feed forward control loop to respond to a change in testing conditions prior to sensing a temperature change of the integrated circuit, the second flowrate being associated with a second valve setting, and the second valve setting being based on at least the desired temperature setpoint and the new testing conditions.

2. The method of claim 1, further comprising:
    supplying an amount of energy to at least one cold plate heater;
    determining a temperature for the integrated circuit;
    comparing the determined integrated circuit temperature to the desired temperature setpoint; and
    modifying the amount of energy supplied to the heater in response to a difference between the determined temperature and the desired temperature setpoint utilizing a feedback control loop for fine control, wherein the fine control supplements coarse control provided by modifying the chilled fluid flowrate in a two-level control scheme.

3. The method of claim 2, wherein modifying the chilled fluid flowrate utilizing a feed forward control loop and modifying the amount of energy supplied to the heater utilizing a feedback control loop for fine control comprise modifying the chilled fluid flowrate utilizing a feed forward control loop integrated with modifying the amount of energy supplied to the heater utilizing a feedback control loop for fine control.

4. The method of claim 2, wherein modifying the chilled fluid flowrate utilizing a feed forward control loop and modifying the amount of energy supplied to the heater utilizing a feedback control loop for fine control comprise modifying the chilled fluid flowrate utilizing a feed forward control loop in series with modifying the amount of energy supplied to the heater utilizing a feedback control loop for fine control.

5. The method of claim 2, wherein modifying the chilled fluid flowrate utilizing a feed forward control loop and modifying the amount of energy supplied to the heater utilizing a feedback control loop for fine control comprise modifying the chilled fluid flowrate utilizing a feed forward control loop in parallel with modifying the amount of energy supplied to the heater utilizing a feedback control loop for fine control.

6. The method of claim 2, wherein determining the temperature for the integrated circuit comprises receiving an indication of temperate from one or more On-Chip-Temperature-Sensors (OCTS).

7. The method of claim 1, further comprising:
    determining a desired cold plate thermal resistance based on one or more of the desired temperature setpoint, current power dissipation, actual integrated circuit to coldplate thermal interface resistance, chiller inlet temperature, heater setting, and a mid-point of a control range of any cold plate heaters; and
    after determining the desired cold plate thermal resistance, calculating the second valve setting based on a characterization curve relating cold plate thermal resistance with valve settings.

8. The method of claim 1, further comprising determining the desired temperature setpoint.

9. The method of claim 8, wherein determining the desired temperature setpoint comprises determining the desired temperature setpoint based on a design to simulate customer conditions.

10. The method of claim 8, wherein determining the desired temperature setpoint comprises determining the desired temperature setpoint based on a design to detect a particular failure mode.

11. The method of claim 8, wherein determining the desired temperature setpoint comprises determining the desired temperature setpoint based on user input.

12. The method of claim 8, wherein the desired temperature setpoint relates to a junction temperature.

13. The method of claim 8, wherein the desired temperature setpoint relates to an average chip temperature.

14. The method of claim 1, further comprising creating a coldplate characterization curve.

15. The method of claim 14, wherein creating a coldplate characterization curve comprises creating a table of coldplate thermal resistances versus proportional control valve settings.

16. The method of claim 1, wherein the change in testing conditions comprises one or more of a change in power applied to the integrated circuit, an actual chip to cold plate thermal interface resistance, a chiller inlet temperature, or a heater setting.

17. The method of claim 1, wherein supplying the chilled fluid to the cold plate comprises pumping cooling fluid through the cold plate and a chiller.

* * * * *